(12) United States Patent
Chu et al.

(10) Patent No.: US 10,014,839 B2
(45) Date of Patent: Jul. 3, 2018

(54) METHODS AND SYSTEMS FOR INTELLIGENT DUAL-CHANNEL VOLUME ADJUSTMENT

(71) Applicant: MOTOROLA SOLUTIONS, INC, Chicago, IL (US)

(72) Inventors: Wei Chu, Chengdu (CN); Hui-Min Han, Chengdu (CN); De-Ting Kong, Chengdu (CN); Jian-Hai Qi, Chengdu (CN); Li-Cheng Zhao, Chengdu (CN)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/506,796

(22) PCT Filed: Oct. 6, 2014

(86) PCT No.: PCT/CN2014/088106
§ 371 (c)(1),
(2) Date: Feb. 27, 2017

(87) PCT Pub. No.: WO2016/054763
PCT Pub. Date: Apr. 14, 2016

(65) Prior Publication Data
US 2017/0279427 A1 Sep. 28, 2017

(51) Int. Cl.
*H03G 3/30* (2006.01)
*H03G 3/10* (2006.01)
*H04B 1/50* (2006.01)

(52) U.S. Cl.
CPC ............ *H03G 3/3005* (2013.01); *H03G 3/10* (2013.01); *H04B 1/50* (2013.01)

(58) Field of Classification Search
CPC .......... H03G 3/3005; H03G 3/02; H03G 3/10; H03G 3/14; H04B 1/50
(Continued)

(56) References Cited

U.S. PATENT DOCUMENTS

| 3,700,811 A | 10/1972 | Davidson |
| 7,266,501 B2 | 9/2007 | Saunders et al. |

(Continued)

FOREIGN PATENT DOCUMENTS

| EP | 2574015 A1 | 3/2013 |
| GB | 2358990 A | 8/2001 |

(Continued)

OTHER PUBLICATIONS

The International Search Report and the Written Opinion, corresponding patent application No. PCT/CN2014/088106, filed Oct. 6, 2014, all pages.

*Primary Examiner* — Jason R Kurr

(57) ABSTRACT

Disclosed herein are methods and systems for intelligent dual-channel volume adjustment. One embodiment takes the form of a dual-watch mobile radio that includes a first receiver, a second receiver, an audio output port, a one-dimensional (1-D) volume control, and a controller programmed to carry out a set of functions. The set of functions includes receiving first and second audio signals from the first and second receivers, respectively, and generating first and second amplified audio signals at least in part by applying first and second signal gains to the first and second audio signals, respectively, as well as outputting the first and second amplified audio signals via the audio output port. The set of functions also includes receiving volume-control commands from the 1-D volume control, and responsively adjusting the first and second signal gains at least in part by applying a gain function to the first and second signal gains.

20 Claims, 13 Drawing Sheets

(58) Field of Classification Search
USPC .................................................. 381/104, 109
See application file for complete search history.

(56) References Cited

U.S. PATENT DOCUMENTS

| | | |
|---|---|---|
| 7,941,198 B2 | 5/2011 | Richey et al. |
| 8,082,051 B2 | 12/2011 | Mihelich et al. |
| 8,315,398 B2 | 11/2012 | Katsianos |
| RE44,261 E | 6/2013 | Jacobs |
| 8,699,963 B2 | 4/2014 | Chen et al. |
| 2007/0236344 A1 | 10/2007 | Desrosiers et al. |
| 2009/0022338 A1* | 1/2009 | Wong ..................... H03G 3/001 381/109 |
| 2010/0054497 A1* | 3/2010 | Bull ......................... H03G 3/02 381/104 |
| 2015/0086042 A1* | 3/2015 | Ito ........................... G06F 3/165 381/109 |

FOREIGN PATENT DOCUMENTS

| | | |
|---|---|---|
| WO | 9627952 | 9/1996 |
| WO | 9908380 | 2/1999 |

* cited by examiner

METHODS AND SYSTEMS FOR INTELLIGENT DUAL-CHANNEL VOLUME ADJUSTMENT

BACKGROUND OF THE INVENTION

Wireless-communication infrastructures have enabled the dawn of all sorts of devices that do not require hardwired connections when sending and receiving data. Such devices, and many others, are often referred to as wireless-communication devices (WCDs). A certain subset of WCDs can establish a communication link with multiple entities simultaneously. WCDs that can receive two incoming signals at once are sometimes referred to as dual-watch mobile radios. In the public-safety context, dual-watch mobile radios provide great value to their users. Public safety personnel equipped with dual-watch mobile radios can monitor multiple channels at once and gather more information than would be possible if they were to use a non-dual-watch WCD. The ability to process more data is imperative as the immediacy and efficacy with which public-safety responders can communicate with one another are quite often determinative with respect to how positive the ultimate outcome of a given incident can be. Accordingly, there is a need for the present methods and systems for intelligent dual-channel volume adjustment.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
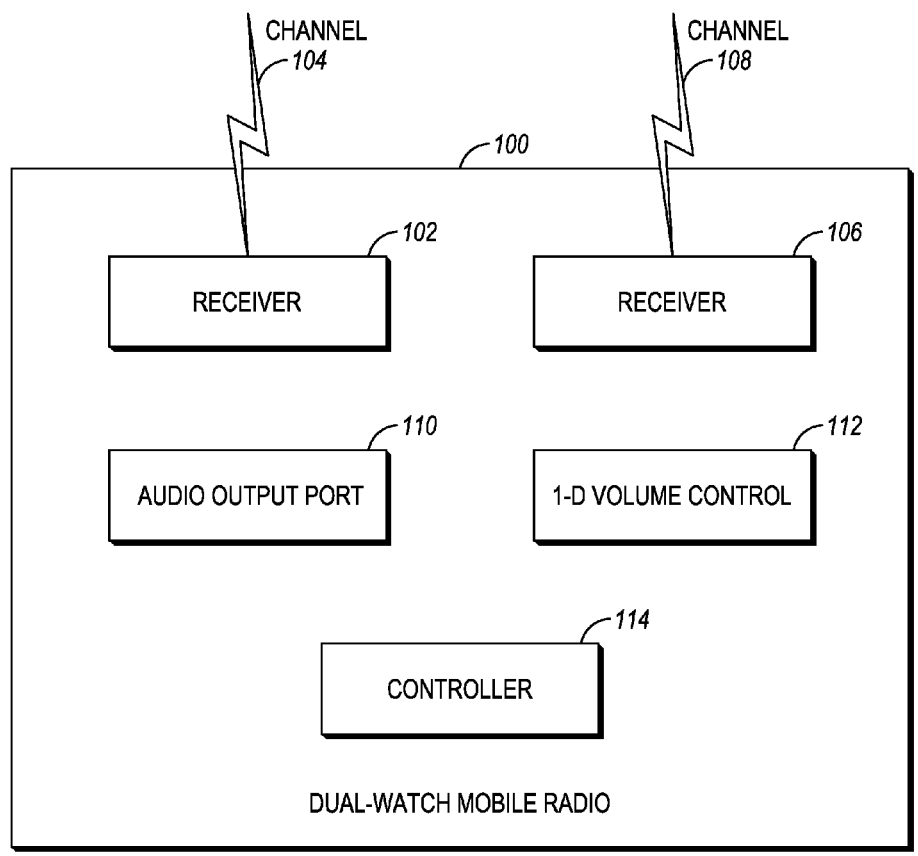
FIG. 1 depicts a first example dual-watch mobile radio, in accordance with an embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed herein are methods and systems for intelligent dual-channel volume adjustment. One embodiment takes the form of a dual-watch mobile radio that includes a first receiver tuned to a first channel, a second receiver tuned to a second channel, an audio output port, a one-dimensional (1-D) volume control, and a controller programmed to carry out a set of functions. The set of functions includes receiving a first audio signal via the first channel from the first receiver, and generating a first amplified audio signal at least in part by applying a first-signal gain to the first audio signal. The set of functions also includes receiving a second audio signal via the second channel from the second receiver, and generating a second amplified audio signal at least in part by applying a second-signal gain to the second audio signal. The set of functions also includes outputting the first and second amplified audio signals via the audio output port. The set of functions also includes receiving volume-control commands from the 1-D volume control. Each received volume-control command has a degree. The set of functions also includes adjusting the first-signal gain and the second-signal gain according to the received volume-control commands. Adjusting the first-signal gain and the second-signal gain for each such received volume-control command includes applying a first gain function to the first-signal gain and the second-signal gain when the degree is in a first degree range and instead applying a second gain function to the first-signal gain and the second-signal gain when the degree is in a second degree range.

Another embodiment takes the form of a process carried out by a dual-watch mobile radio. The process includes receiving a first audio signal via a first channel from a first receiver, and generating a first amplified audio signal at least in part by applying a first-signal gain to the first audio signal. The process also includes receiving a second audio signal via a second channel from a second receiver, and generating a second amplified audio signal at least in part by applying a second-signal gain to the second audio signal. The process also includes outputting the first and second amplified audio signals via an audio output port. The process also includes receiving volume-control commands from a 1-D volume control. Each received volume-control command has a degree. The process includes adjusting the first-signal gain and the second-signal gain according to the received volume-control commands. Adjusting the first-signal gain and the second-signal gain for each such received volume-control command includes applying a first gain function to the first-signal gain and the second-signal gain when the degree is in a first degree range and instead applying a second gain function to the first-signal gain and the second-signal gain when the degree is in a second degree range.

Moreover, any of the variations and permutations described in the ensuing paragraphs and anywhere else in this disclosure can be implemented with respect to any embodiments, including with respect to any method embodiments and with respect to any system embodiments. Furthermore, this flexibility and cross-applicability of embodiments is present in spite of the use of slightly different language (e.g., process, method, steps, functions, set of functions, and the like) to describe and or characterize such embodiments.

In at least one embodiment, the one-dimensional volume control is a rotary control knob. In at least one such embodiment, the degree is a rotation rate. In at least one such embodiment, the first degree range corresponds to rotation rates that do not exceed a rotation-rate threshold and the second degree range corresponds to rotation rates that do exceed the rotation-rate threshold.

In at least one embodiment, the one-dimensional volume control is a two-button volume control. Hereafter, embodiments wherein the one-dimensional volume control is a two-button volume control are referred to as two-button embodiments. In at least one two-button embodiment, the two-button volume control includes two separate buttons. In at least one other two-button embodiment, the two-button volume control includes one momentary rocker switch.

In at least one two-button embodiment, the degree is a depression duration. In at least one such embodiment, the first degree range corresponds to depression durations that do not exceed a depression-duration threshold and the second degree range corresponds to depression durations that do exceed the depression-duration threshold.

In at least one two-button embodiment, the degree is a depression rate. In at least one such embodiment, the first degree range corresponds to depression rates that do not exceed a depression-rate threshold and the second degree range corresponds to depression rates that do exceed the depression-rate threshold.

In at least one embodiment, the one-dimensional volume control is a volume slider. In at least one such embodiment, the degree is a slide velocity. In at least one such embodiment, the first degree range corresponds to slide velocities that do not exceed a slide-velocity threshold and the second degree range corresponds to slide velocities that do exceed the slide-velocity threshold.

In at least one embodiment, at any given time, one of the first and second channels is designated by the dual-watch mobile radio as its selected channel and the other as its unselected channel. In at least one such embodiment, the set of functions further includes designating the first channel as its selected channel and the second channel as its unselected channel when the first-signal gain exceeds the second-signal gain by more than a channel-swap threshold. The set of functions further includes designating the second channel as its selected channel and the first channel as its unselected channel when the second-signal gain exceeds the first-signal gain by more than the channel-swap threshold. The set of functions further includes swapping which of the first and second channels is designated as its selected and unselected channels when a difference between the first-signal gain and the second-signal gain falls below the channel-swap threshold. Hereafter, embodiments wherein, at any given time, one of the first and second channels is designated by the dual-watch mobile radio as its selected channel and the other as its unselected channel in the manner described above are referred to as selected-channel embodiments.

In at least one selected-channel embodiment, the dual-watch mobile radio further includes a transmitter. In at least one such embodiment, the dual-watch mobile radio transmits any outbound media via the transmitter on its current selected channel.

In at least one selected-channel embodiment, the dual-watch mobile radio further includes a first transmitter and a second transmitter. In at least one such embodiment, the dual-watch mobile radio transmits any outbound media over the first channel via the first transmitter when the first channel is its current selected channel, and the dual-watch mobile radio transmits any outbound media over the second channel via the second transmitter when the second channel is its current selected channel.

In at least one selected-channel embodiment, the set of functions further includes outputting a notification responsive to the difference between the first-signal gain and the second-signal gain falling below the channel-swap threshold. In at least one such embodiment, the notification includes a notification sound. The notification sound is a first sound when the difference between the first-signal gain and the second-signal gain falls below the channel-swap threshold as a result of the one-dimensional volume control being adjusted in a first direction, and the notification sound is a second sound when the difference between the first-signal gain and the second-signal gain falls below the channel-swap threshold as a result of the one-dimensional volume control being adjusted in a second direction.

In at least one selected-channel embodiment, the audio output port includes a first output port to a first speaker set and a second output port to a second speaker set. In at least one such embodiment, outputting the first and second amplified audio signals via the audio output port includes (i) outputting the first amplified signal via the first output port and (ii) outputting the second amplified signal via the second output port.

In at least one selected-channel embodiment, the audio output port includes a first output port to a first speaker set and a second output port to a second speaker set, wherein the first speaker set is configured to be closer to a user's ear than the second speaker set. In at least one such embodiment, outputting the first and second amplified audio signals via the audio output port includes (i) outputting the one of the first and second amplified signals that corresponds to the selected channel via the first output port and (ii) outputting the other of the first and second amplified signals via the second output port. In at least one such embodiment, the first speaker set is an in-ear speaker set and the second speaker set is not an in-ear speaker set.

In at least one selected-channel embodiment, each received volume-control input further has a direction. In at least one such embodiment, applying the first gain function to the first-signal gain and the second-signal gain includes (i) changing the gain of the signal that corresponds to the selected channel in the direction by a first amount and (ii) changing the gain of the signal that corresponds to the unselected channel in the direction by a second amount, wherein the first amount is greater than the second amount by a first difference. Applying the second gain function to the first-signal gain and the second-signal gain includes (iii) changing the gain of the signal that corresponds to the selected channel in the direction by a third amount and (iv) changing the gain of the signal that corresponds to the unselected channel in the direction by a fourth amount, wherein the third amount is greater than the fourth amount by a second difference, wherein the first difference is greater than the second difference.

In at least one selected-channel embodiment, each received volume-control input further has a direction that is either a first direction or a second direction. In at least one such embodiment, applying the first gain function to the first-signal gain and the second-signal gain includes (i) increasing the first-signal gain and decreasing the second-signal gain when the direction is the first direction and (ii) increasing the second-signal gain and decreasing the first-signal gain when the direction is the second direction. Applying the second gain function to the first-signal gain and the second-signal gain includes (iii) changing the gain of the signal that corresponds to the selected channel in the direction and (iv) changing the gain of the signal that corresponds to the unselected channel in the direction.

In at least one selected-channel embodiment, each received volume-control input further has a direction that is either a first direction or a second direction. In at least one such embodiment, applying the first gain function to the first-signal gain and the second-signal gain includes (i) increasing the gain of the signal that corresponds to the selected channel and decreasing the gain of the signal that corresponds to the unselected channel when the direction is the first direction and (ii) increasing the gain of the signal that corresponds to the unselected channel and decreasing the gain of the signal that corresponds to the selected channel when the direction is the second direction. Applying the second gain function to the first-signal gain and the second-signal gain includes (iii) changing the gain of the signal that corresponds to the selected channel in the direction and (iv) changing the gain of the signal that corresponds to the unselected channel in the direction.

Before proceeding with this detailed description, it is noted that the entities, connections, arrangements, and the like that are depicted in—and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—can only properly be read as being constructively preceded by a clause such as "In at least one embodiment, . . . ." And it is for reasons akin to brevity and clarity of presentation that this implied leading clause is not repeated ad nauseum in this detailed description.

FIG. 1 depicts a first example dual-watch mobile radio, in accordance with an embodiment. In particular, FIG. 1 depicts a dual-watch mobile radio 100. In the depiction of the dual-watch mobile radio 100, all internal connections are omitted; this is not to suggest that the various components 102, 106, and 110-114 operate in isolation; rather, the lack of depicted internal connections is solely for the sake of visual simplicity. In all depictions of the dual-watch mobile radio 100, the various components can indeed communicate with each other as needed, and the communication links may take the form of wired and wireless connections.

The example dual-watch mobile radio 100 of FIG. 1 includes a receiver 102 that is configured to receive signals sent via a channel 104, a receiver 106 that is configured to receive signals sent via a channel 108, an audio output port 110, a 1-D volume control 112, and a controller 114. The receivers 102 and 106 can be tuned to receive signals from a plurality of different wireless-communication channels. In FIG. 1, the receiver 102 is tuned to a particular wireless-communication channel, the channel 104, and the receiver 106 is tuned to a particular wireless-communication channel, the channel 108. Signals that are received via the receiver 102 are amplified according to a first-signal gain. Signals that are received via the receiver 106 are amplified according to a second-signal gain. Thus, the volume of signals received via the receiver 102 and the volume of signals received via the receiver 106 can be independently adjusted by applying various first-signal gains and second-signal gains.

In at least one embodiment, at any given time, one of the first and second channels, channels 104 and 108 respectively, is designated by the dual-watch mobile radio 100 as its selected channel and the other as its unselected channel. In at least one such embodiment, the set of functions further includes designating the first channel, channel 104, as its selected channel and the second channel, channel 108, as its unselected channel when the first-signal gain exceeds the second-signal gain by more than a channel-swap threshold. In at least one such embodiment, the set of functions further includes designating the second channel, channel 108, as its selected channel and the first channel, channel 104, as its unselected channel when the second-signal gain exceeds the first-signal gain by more than the channel-swap threshold. In at least one such embodiment, the set of functions further includes swapping which of the first and second channels, channels 104 and 108 respectively, is designated as its selected and unselected channels when a difference between the first-signal gain and the second-signal gain falls below the channel-swap threshold.

The 1-D volume control 112 is a physical interface that is adjustable only up or down along the single dimension of volume level. It is noted that the physical interface could take the form of an interface like a rotary knob, a two-button volume control, a rocker switch, and the like. The physical interface could also take the form of a 1-D volume control (e.g., a volume slider) presented on an interface such as a touchscreen. The 1-D volume control 112 may take any form deemed suitable by those of skill in the art for a given implementation.

In at least one embodiment, the set of functions further includes outputting a notification (e.g., a sound, a vibration, a visual indicator, etc.) responsive to the difference between the first-signal gain and the second-signal gain falling below the channel-swap threshold. In at least one such embodiment, the notification includes a notification sound that is a first sound when the difference between the first-signal gain and the second-signal gain falls below the channel-swap threshold as a result of the one-dimensional volume 112 control being adjusted in a first direction, and that is a second (i.e., different) sound when the difference between the first-signal gain and the second-signal gain falls below the channel-swap threshold as a result of the one-dimensional volume 112 control being adjusted in a second direction.

In at least one embodiment, each received volume-control input further has a direction. In at least one such embodiment, applying the first gain function to the first-signal gain and the second-signal gain includes (i) changing the gain of the signal that corresponds to the selected channel in the direction by a first amount and (ii) changing the gain of the signal that corresponds to the unselected channel in the direction by a second amount, wherein the first amount is greater than the second amount by a first difference. Applying the second gain function to the first-signal gain and the second-signal gain includes (iii) changing the gain of the signal that corresponds to the selected channel in the direction by a third amount and (iv) changing the gain of the signal that corresponds to the unselected channel in the direction by a fourth amount, wherein the third amount is greater than the fourth amount by a second difference. In at least one embodiment, the first difference is greater than the second difference.

In at least one embodiment, each received volume-control input further has a direction that is either a first direction or a second direction. In at least one such embodiment, applying the first gain function to the first-signal gain and the second-signal gain includes (i) increasing the first-signal gain and decreasing the second-signal gain when the direction is the first direction and (ii) increasing the second-signal gain and decreasing the first-signal gain when the direction is the second direction. Applying the second gain function to the first-signal gain and the second-signal gain includes (iii) changing the gain of the signal that corresponds to the selected channel in the direction and (iv) changing the gain of the signal that corresponds to the unselected channel in the direction.

In at least one embodiment, each received volume-control input further has a direction that is either a first direction or a second direction. In at least one such embodiment, applying the first gain function to the first-signal gain and the second-signal gain includes (i) increasing the gain of the signal that corresponds to the selected channel and decreasing the gain of the signal that corresponds to the unselected channel when the direction is the first direction and (ii) increasing the gain of the signal that corresponds to the unselected channel and decreasing the gain of the signal that corresponds to the selected channel when the direction is the second direction. Applying the second gain function to the first-signal gain and the second-signal gain includes (iii) changing the gain of the signal that corresponds to the selected channel in the direction and (iv) changing the gain of the signal that corresponds to the unselected channel in the direction.

Figure 2:
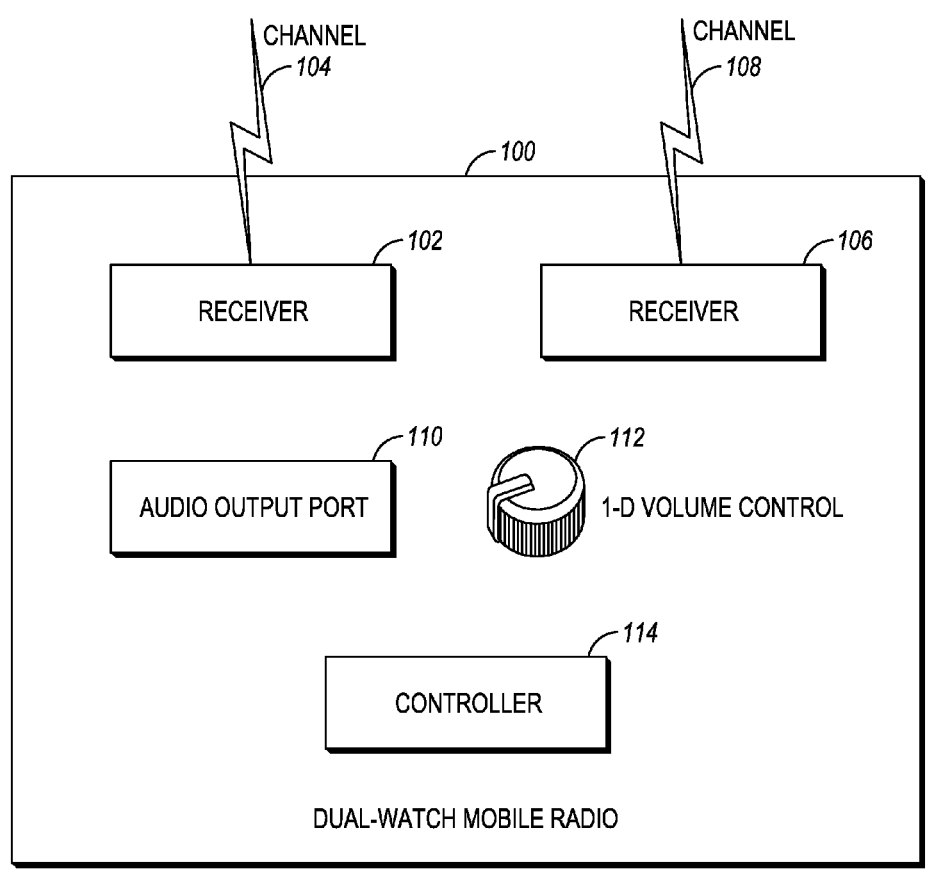
FIG. 2 depicts the dual-watch mobile radio of FIG. 1 having a first example 1-D volume control, in accordance with an embodiment.

FIG. 2 depicts the dual-watch mobile radio of FIG. 1 having a first example 1-D volume control, in accordance with an embodiment. In particular, FIG. 2 depicts the first example 1-D volume control 112 as a rotary knob. In at least one embodiment, the first example 1-D volume control 112 can only be twisted clockwise or counterclockwise (i.e., the control knob is not configured to act as a depressible button). In at least one embodiment, the degree is a rotation rate of the first example 1-D volume control 112. Twisting the first example 1-D volume control 112 quickly is associated with a high degree and twisting the first example 1-D volume control 112 slowly is associated with a low degree. In at least one embodiment, the first degree range corresponds to rotation rates that do not exceed a rotation-rate threshold, and the second degree range corresponds to rotation rates that do exceed the rotation-rate threshold.

Figure 3:
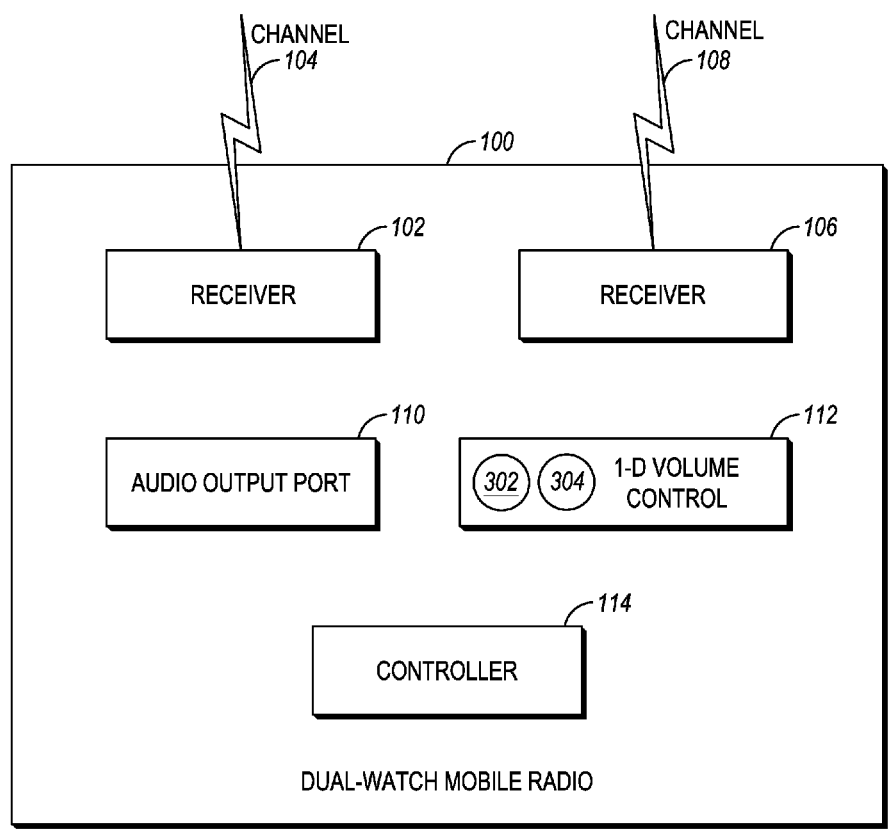
FIG. 3 depicts the dual-watch mobile radio of FIG. 1 having a second example 1-D volume control, in accordance with an embodiment.

FIG. 3 depicts the dual-watch mobile radio of FIG. 1 having a second example 1-D volume control, in accordance with an embodiment. In particular, FIG. 3 depicts the second example 1-D volume control 112 as a two-button volume control. In at least one embodiment, the second example 1-D volume control 112 includes two separate buttons. The second example 1-D volume control 112 includes a button 302 and a button 304. The button 302 is a volume increase button and the button 304 is a volume decrease button.

In at least one embodiment, the second example 1-D volume control 112 is a momentary rocker switch (not shown in the FIGs). The momentary rocker switch often looks like a single bar, perhaps with raised ends, perhaps not. Two ends of the momentary rocker switch can be depressed. One end represents volume increase and the other end represents volume decrease. In at least one such embodiment, the two ends correspond with the two buttons 302 and 304.

In at least one embodiment, the degree is a depression duration of one of the two buttons 302-304. In at least one such embodiment, the first degree range corresponds to depression durations that do not exceed a depression-duration threshold, and the second degree range corresponds to depression durations that do exceed the depression-duration threshold.

In at least one embodiment, the degree is a depression rate of one of the two buttons 302-304. In at least one such embodiment, the first degree range corresponds to depression rates that do not exceed a depression-rate threshold, and the second degree range corresponds to depression rates that do exceed the depression-rate threshold.

Figure 4:
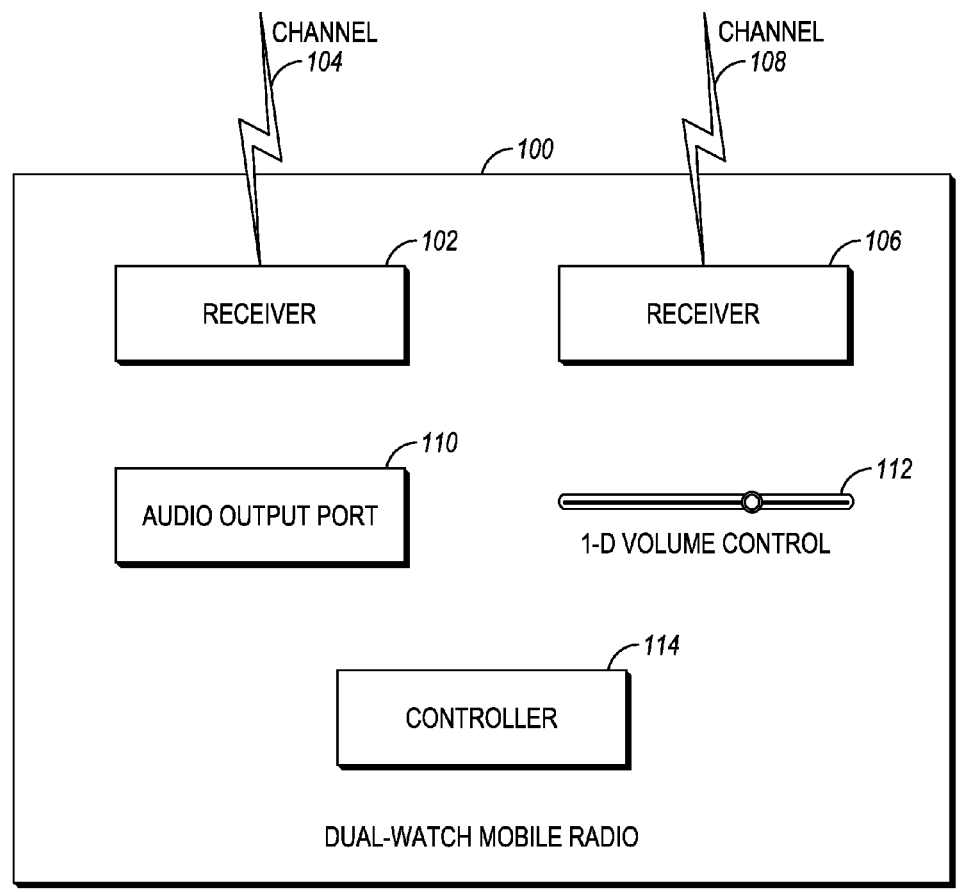
FIG. 4 depicts the dual-watch mobile radio of FIG. 1 having a third example 1-D volume control, in accordance with an embodiment.

FIG. 4 depicts the dual-watch mobile radio of FIG. 1 having a third example 1-D volume control, in accordance with an embodiment. In particular, FIG. 4 depicts the third example 1-D volume control 112 as a volume slider. In at least one such embodiment, the degree is a slide velocity. In at least one embodiment, the first degree range corresponds to slide velocities that do not exceed a slide-velocity threshold, and the second degree range corresponds to slide velocities that do exceed the slide-velocity threshold. The volume slider could be a physical device, or the volume slider could be a graphic depicted on a touchscreen. Moreover, as a general matter, the 1-D volume control 112 could be a physical device but could instead be a depiction on a touchscreen.

Figure 5:
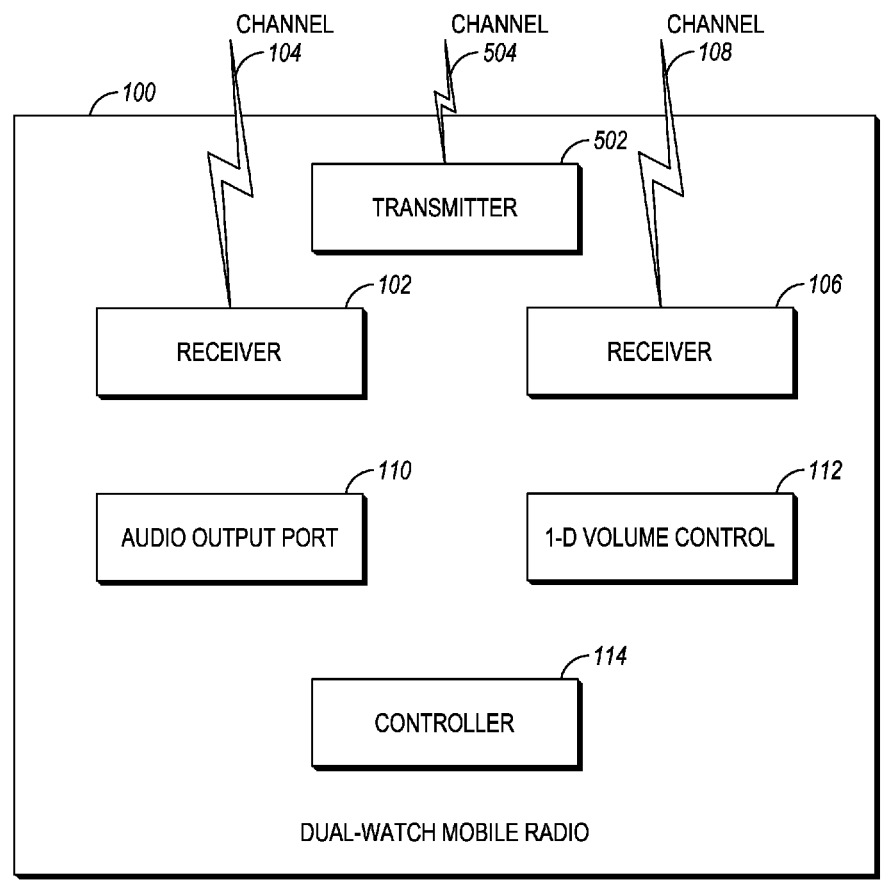
FIG. 5 depicts a second example dual-watch mobile radio having a single transmitter, in accordance with an embodiment.

FIG. 5 depicts a second example dual-watch mobile radio having a single transmitter, in accordance with an embodiment. In particular, FIG. 5 depicts the dual-watch mobile radio 100 of FIG. 1 further including a transmitter 502. The transmitter 502 is configured to communicate via a channel 504. In at least one embodiment, the channel 504 can be one of the channel 104 and the channel 108 at any given instant in time. In at least one embodiment, the dual-watch mobile radio 100 transmits any outbound media via the transmitter 502 on its current selected channel 504. The current selected channel may be one of the channel 104 and the channel 108.

Figure 6:
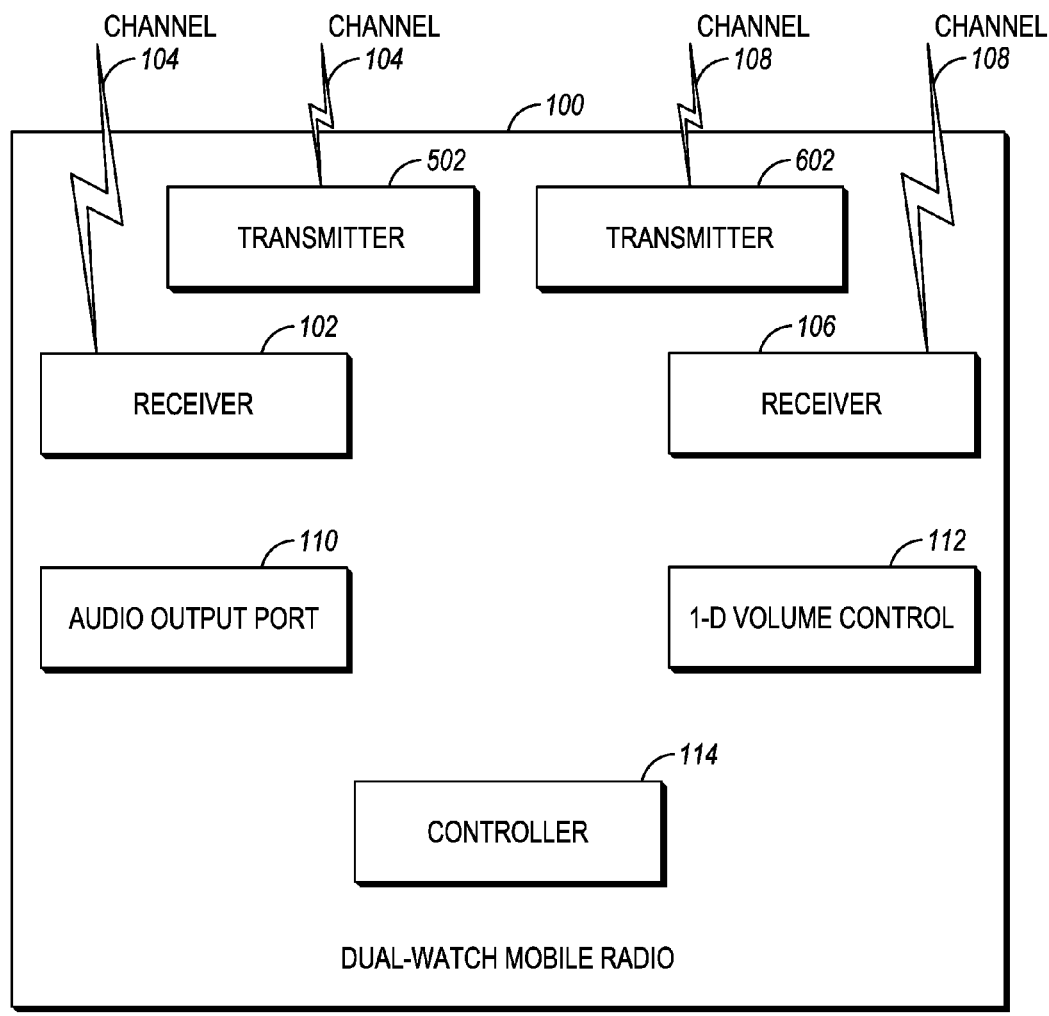
FIG. 6 depicts a third example dual-watch mobile radio having first and second transmitters, in accordance with an embodiment.

FIG. 6 depicts a third example dual-watch mobile radio having first and second transmitters, in accordance with an embodiment. In particular, FIG. 6 depicts the dual-watch mobile radio 100 of FIG. 5 further including a transmitter 602. The transmitter 502 is configured to communicate via the channel 104 and the transmitter 602 is configured to communicate via the channel 108. The transmitter 502 and the receiver 102 may be implemented together as a first transceiver tuned to the channel 104. The transmitter 602 and the receiver 106 may be implemented together as a second transceiver tuned to the channel 108. In at least one embodiment, the dual-watch mobile radio 100 transmits any outbound media over the channel 104, via the transmitter 502, when the first channel, channel 104, is its current selected channel and the dual-watch mobile radio 100 transmits any outbound media over the channel 108, via the transmitter 602, when the second channel, channel 108, is its current selected channel.

Figure 7:
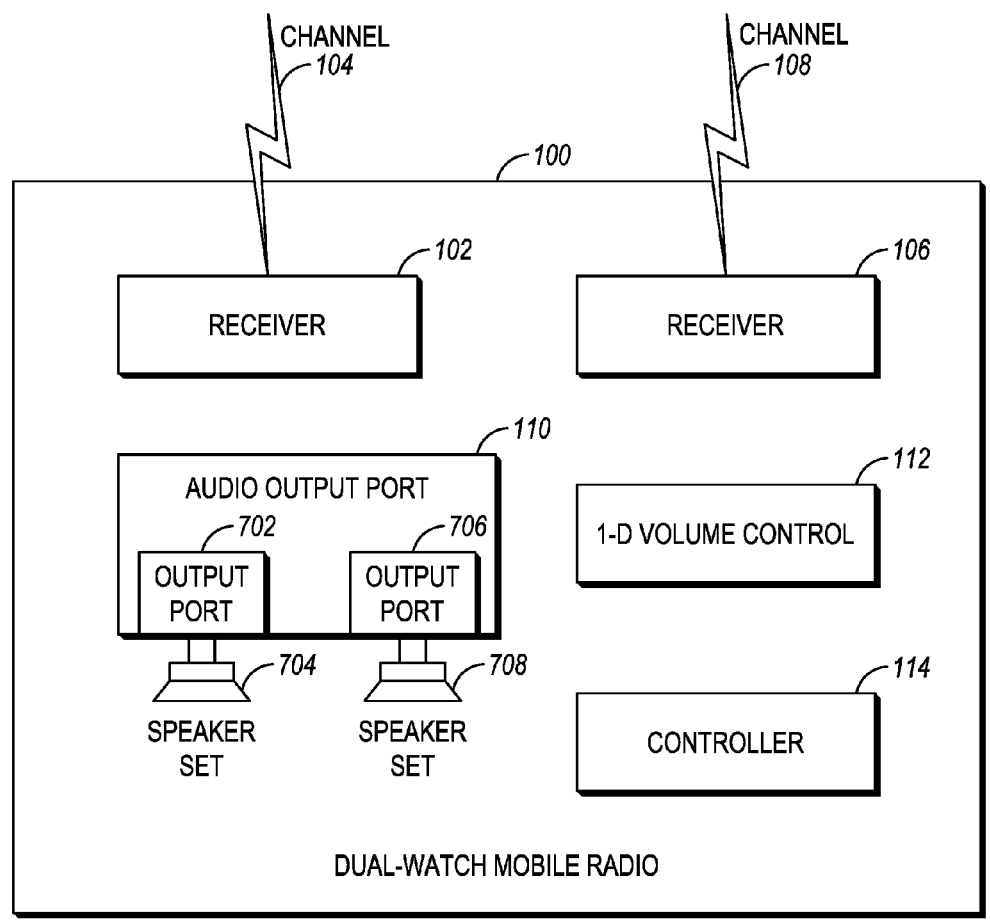
FIG. 7 depicts a fourth example dual-watch mobile radio with a first example speaker-set configuration, in accordance with an embodiment.

FIG. 7 depicts a fourth example dual-watch mobile radio with a first example speaker-set configuration, in accordance with an embodiment. In particular, FIG. 7 depicts the dual-watch mobile radio 100 of FIG. 1 as including two output ports 702 and 706, and as further including two speaker sets 704 and 708. In at least one embodiment, the audio output port 110 of the dual-watch mobile radio 100 includes the first output port 702, which is connected to the first speaker set 704, and the second output port 706, which is connected to the second speaker set 708. In at least one such embodiment, outputting the first and second amplified audio signals via the audio output port 110 includes (i) outputting the first amplified signal via the first output port 702 and (ii) outputting the second amplified signal via the second output port 706.

Figure 8:
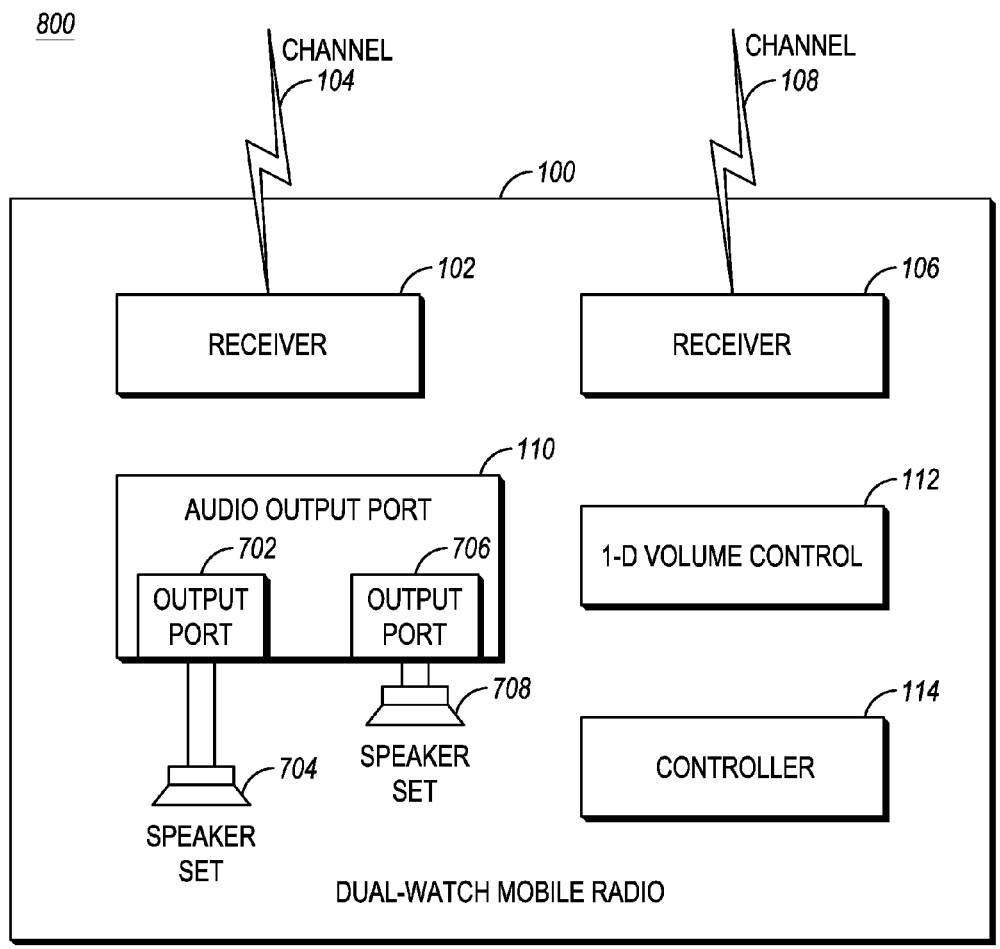
FIG. 8 depicts the fourth example dual-watch mobile radio of FIG. 7 with a second example speaker-set configuration, in accordance with an embodiment.
Figure 8:
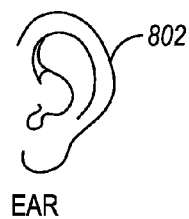

FIG. 8 depicts the fourth example dual-watch mobile radio of FIG. 7 with a second example speaker-set configuration, in accordance with an embodiment. In particular, FIG. 8 depicts a scenario 800 in which the dual-watch mobile radio 100 of FIG. 7 may operate. In at least one embodiment, the first speaker set 704 is configured to be closer to the user's ear 802 than the second speaker set 708. In at least one such embodiment, outputting the first and second amplified audio signals via the audio output port 110 includes (i) outputting the one of the first and second amplified signals that corresponds to the selected channel via the first output port 702 and (ii) outputting the other of the first and second amplified signals via the second output port 706. In at least one such embodiment, the first speaker set 704 is an in-ear speaker set and the second speaker set 708 is not an in-ear speaker set.

Figure 9:
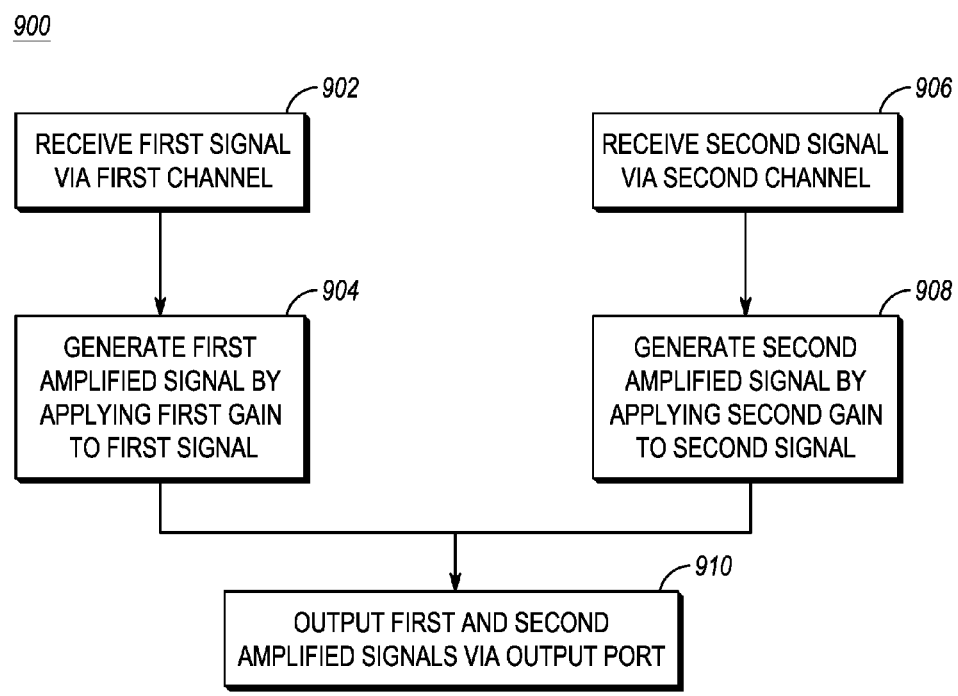
FIG. 9 depicts a first example process, in accordance with an embodiment.

FIG. 9 depicts a first example process, in accordance with an embodiment. In particular, FIG. 9 depicts a process 900, carried out by a dual-watch mobile radio (e.g., the dual-watch mobile radio 100 of FIG. 1). The process 900 includes steps 902-910. At step 902, the dual-watch mobile radio receives a first audio signal via a first channel from a first receiver. At step 904, the dual-watch mobile radio generates a first amplified audio signal at least in part by applying a first-signal gain to the first audio signal. At step 906, the dual-watch mobile radio receives a second audio signal via a second channel from a second receiver. At step 908, the dual-watch mobile radio generates a second amplified audio signal at least in part by applying a second-signal gain to the second audio signal. At step 910, the dual-watch mobile radio outputs the first and second amplified audio signals via an audio output port.

Figure 10:
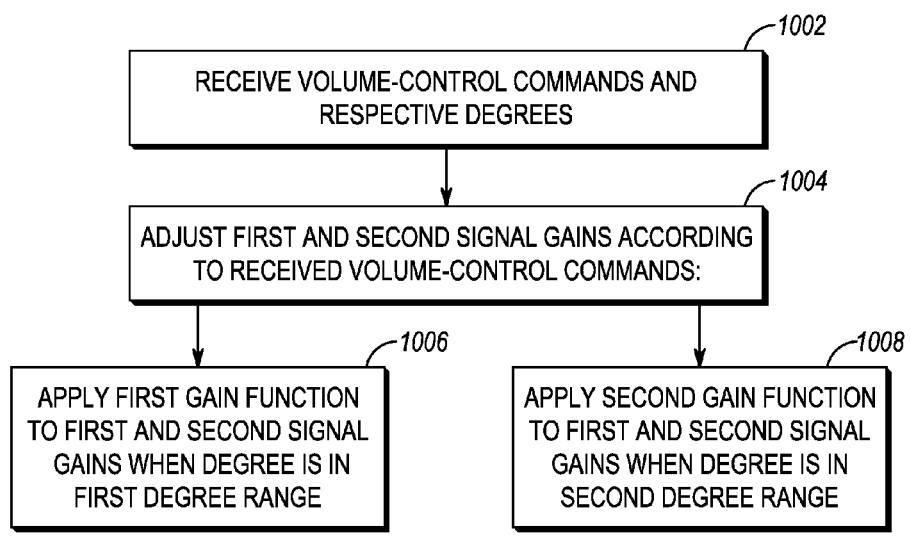
FIG. 10 depicts a second example process, in accordance with an embodiment.

FIG. 10 depicts a second example process, in accordance with an embodiment. In particular, FIG. 10 depicts a process 1000, carried out by a dual-watch mobile radio (e.g., the dual-watch mobile radio 100 of FIG. 1). The process 1000 includes steps 1002-1008. At step 1002, the dual-watch mobile radio receives volume-control commands from a one-dimensional volume control, the respective volume-control commands having respective degrees. At step 1004, the dual-watch mobile radio adjusts the first-signal gain and the second-signal gain according to the received volume-control commands and their respective degrees. For each iteration of the process 1000, only one of steps 1006 and 1008 is carried out. Step 1006 is carried out when the degree is in a first degree range. Step 1008 is carried out when the degree is in a second degree range. In at least one embodiment, the degree ranges are mutually exclusive. At step 1006, the dual-watch mobile radio applies a first gain function to the first-signal gain and the second-signal gain. At step 1008, the dual-watch mobile radio instead applies a second gain function to the first-signal gain and the second-signal gain.

Both of the process 900 and the process 1000 can be carried out by a dual-watch mobile radio such as the dual-watch mobile radio 100. In at least one embodiment, the dual-watch mobile radio 100 carries out both the process 900 and the process 1000. The process 900 and/or the process 1000 can be repeated by the dual-watch mobile radio 100 after completion.

Figure 11:
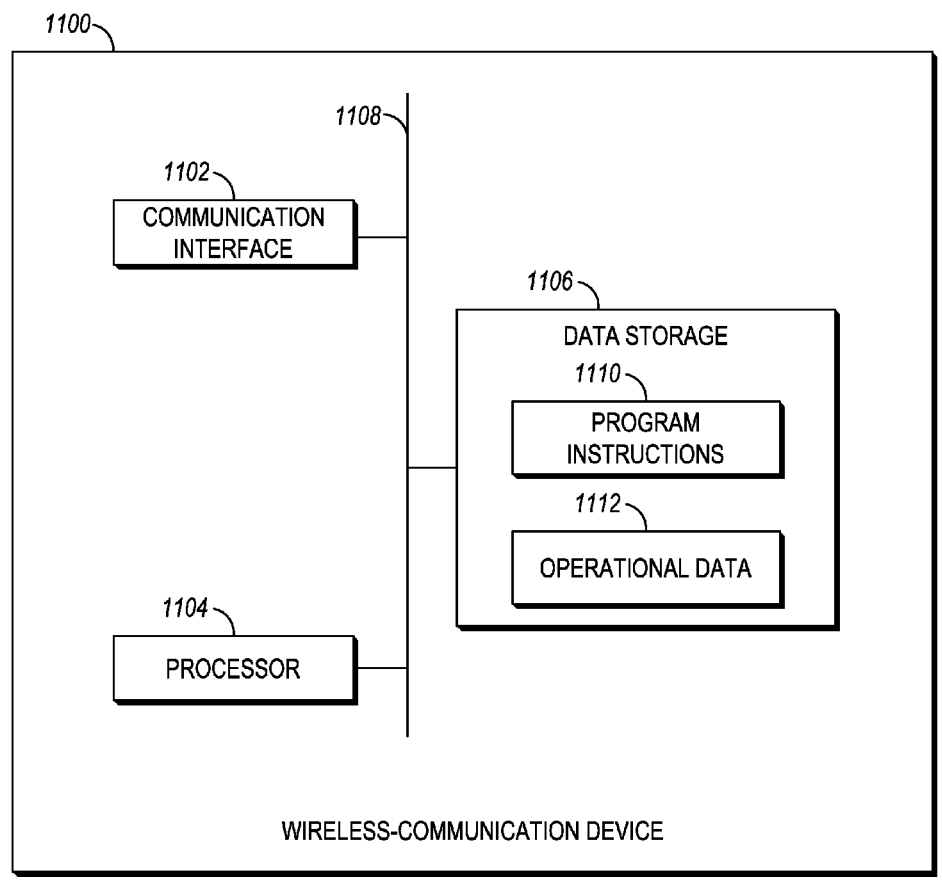
FIG. 11 depicts an example WCD, in accordance with an embodiment.

FIG. 11 depicts an example WCD, in accordance with an embodiment. In particular, FIG. 11 depicts an example WCD 1100 that includes a communication interface 1102, a processor 1104, and a data storage 1106, all of which are communicatively coupled with one another via a system bus (or other suitable communication mechanism, connection, network, or the like) 1108.

The communication interface 1102 may include one or more wireless-communication interfaces such as a receiver, transmitter and transceiver (for communicating according to, e.g., LTE, WiFi, Bluetooth, and/or one or more other protocols) and/or one or more wired-communication interfaces (for communicating according to, e.g., Ethernet, USB, and/or one or more other protocols). As such, the communication interface 1102 may include any necessary hardware (e.g., chipsets, antennas, Ethernet cards, etc.), any necessary firmware, and any necessary software for conducting one or more forms of communication with one or more other entities as described herein. The processor 1104 may include one or more processors of any type deemed suitable by those of skill in the relevant art, some examples including a general-purpose microprocessor and a dedicated digital signal processor (DSP).

The data storage 1106 may take the form of any non-transitory computer-readable medium or combination of such media, some examples including flash memory, read-only memory (ROM), and random-access memory (RAM) to name but a few, as any one or more types of non-transitory data-storage technology deemed suitable by those of skill in the relevant art could be used. As depicted in FIG. 11, the data storage 1106 contains program instructions 1110 executable by the processor 1104 for carrying out various functions as well as operational data 1112.

In an embodiment in which a WCD such as the example WCD 1100 is arranged, programmed, and configured to carry out processes such as the process 900 of FIG. 9 and/or the process 1000 of FIG. 10 described above, the program instructions 1110 are executable by the processor 1104 for carrying out those functions; in instances where other entities described herein have a structure similar to that of the example WCD 1100, the respective program instructions 1110 for those respective devices are executable by their respective processors 1104 to carry out functions respectively performed by those devices.

In various embodiments, a device such as the WCD 1100 could be suitably equipped, programmed, and configured to carry out the one or more functions described in this disclosure as being carried out by any one or any combination of the entities described herein and/or any other suitable WCDs. In some embodiments, a device or system such as the WCD 1100 is equipped, programmed, and configured to carry out the process 900 and the process 1000 that are described above. Moreover, any one or more of the entities described herein could have an architecture or arrangement similar to that described in connection with the example WCD 1100.

Furthermore, the example WCD 1100 and the example dual-watch mobile radio 100 could be considered to be two different depictions of the same device. Indeed, as one example of a cross-mapping that could be done between FIG. 1 and FIG. 11, the communication interface 1102 could include the receiver 102 and the receiver 106. As another example, the processor 1104 could be or include the controller 114. And certainly numerous other examples could be listed. And though a user interface is not depicted in FIG. 11, the WCD 1100 could have a user interface, and that user interface could include the 1-D volume control 112, and could also include the various speaker sets described herein, among numerous other examples that could be listed here.

Figure 12:
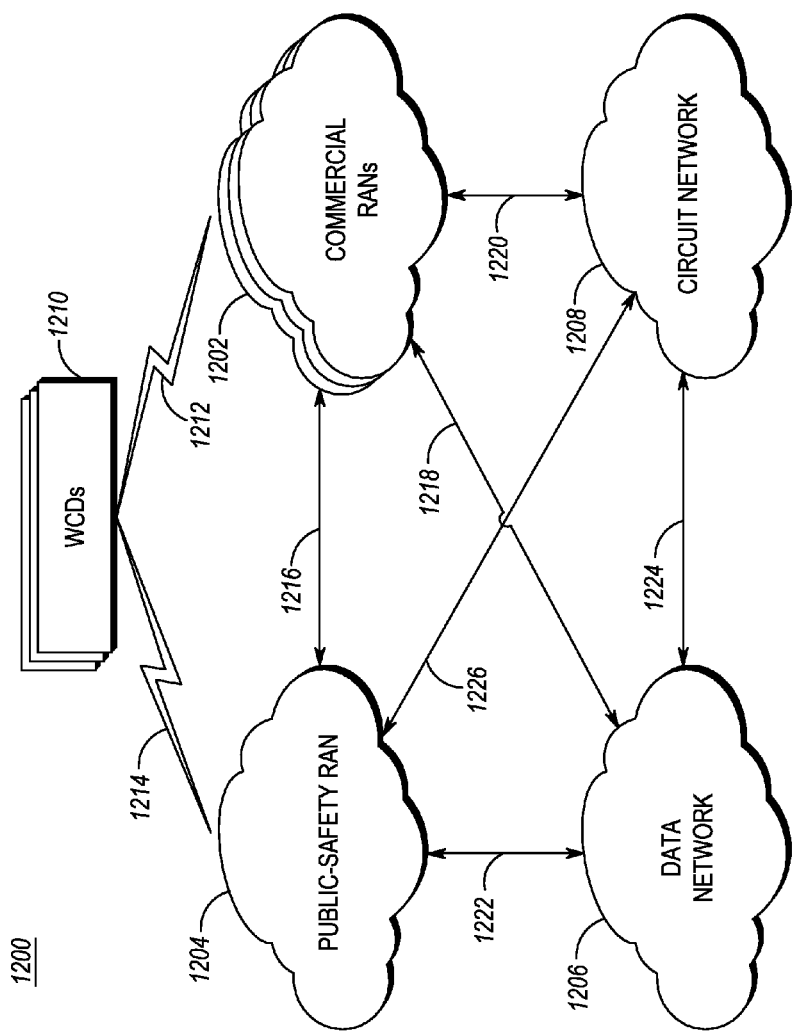
FIG. 12 depicts an example communication system, in accordance with an embodiment.
Figure 13:
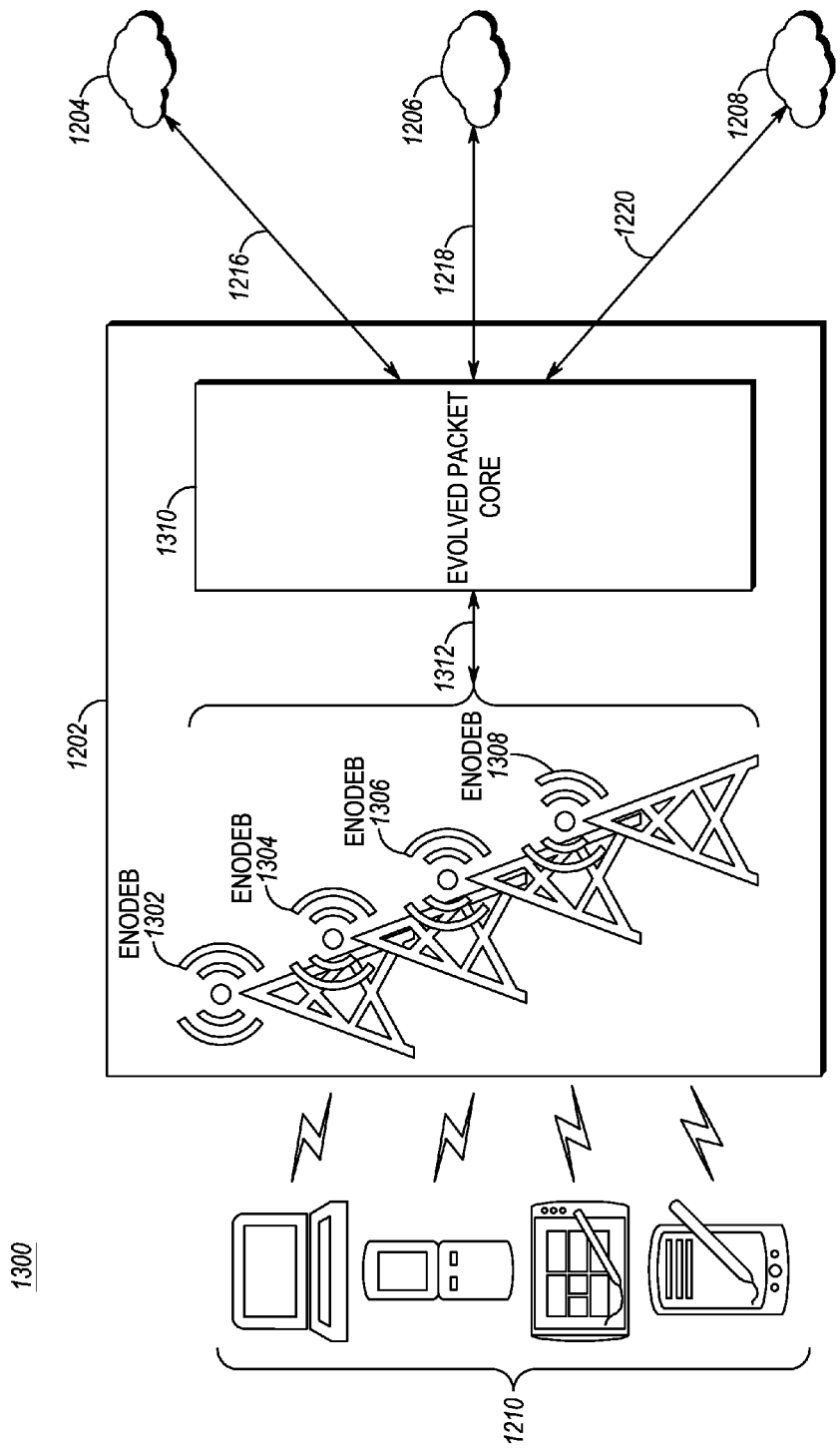
FIG. 13 depicts a further example of the communication system of FIG. 12, in accordance with an embodiment.

The next portion of this disclosure includes descriptions of FIGS. 12-13, which in general depict a communication system in which WCDs communicate via one or more radio access networks (RANs). It is explicitly noted that WCDs that communicate via one or more RANs may also be capable of communicating directly with one another in a manner known by those of skill in the relevant art. Furthermore, mobile radios that are capable of both direct-mode communication and RAN-based communication could certainly carry out and embody the present methods and systems as well. FIGS. 12-13 together help establish a possible operational context for the presently described systems and processes. Herein, many embodiments include reference to one or more networks; some examples of which are described below with reference to FIGS. 12-13.

FIG. 12 depicts an example communication system, in accordance with an embodiment. In particular, FIG. 12 depicts an example communication system 1200 that includes one or more commercial RANs 1202, a public-safety RAN 1204, a data network 1206, a circuit network 1208, WCDs 1210, and communication links 1212-1226. An example commercial RAN 1202 is discussed below in connection with FIG. 13, though in general, each RAN 1202 or 1204 includes typical RAN elements such as base stations, base station controllers, routers, switches, and the like, arranged, connected, and programmed to provide wireless service to user equipment (e.g., WCDs 1210) in a manner known to those of skill in the relevant art.

The public-safety RAN 1204 may include one or more packet-switched networks and/or one or more circuit-switched networks, and in general functions to provide one or more public-safety agencies with any necessary computing and communication needs. Thus, the public-safety RAN 1204 may include a dispatch center communicatively connected with the data network 1206 and also with the circuit network 1208, for retrieving and transmitting any necessary public-safety-related data and communications. The public-safety RAN 1204 may also include any necessary computing, data-storage, and data-presentation resources utilized by public-safety personnel in carrying out their public-safety functions. Moreover, the public-safety RAN 1204 may include one or more network access servers (NASs), gateways, and the like for bridging communications to one or more other entities and/or networks, such as the commercial RANs 1202, the data network 1206, and the circuit network 1208, as representative examples.

The data network 1206 may be, include, or be a part of the global network of networks typically referred to as the Internet. The data network 1206 may be a packet-switched network, and entities (i.e., servers, routers, computers, and the like) that communicate over the data network 1206 may be identified by a network address such as an Internet Protocol (IP) address. Moreover, the data network 1206 may include one or more NASs, gateways, and the like for bridging communications to one or more other entities and/or networks, such as the commercial RANs 1202, the public-safety RAN 1204, and the circuit network 1208, as representative examples.

The circuit network 1208 may be, include, or be a part of the circuit-switched telephone network commonly referred to as the public switched telephone network (PSTN), and in general functions to provide circuit-switched communications to various communication entities as is known in the relevant art. Moreover, the circuit network 1208 may include one or more NASs, gateways, and the like for bridging communications to one or more other entities and/or networks, such as the commercial RANs 1202, the public-safety RAN 1204, and the data network 1206, as representative examples.

The WCDs 1210 may be any suitable computing and communication devices configured to engage in wireless communication with one or both of (i) the commercial RANs 1202 over the air interface 1212 as is known to those in the relevant art and (ii) the public-safety RAN 1204 over the air interface 1214 as is known to those in the relevant art. Some example WCDs 1210, communication links 1212, and communication links 1214 are discussed above in connection with the various figures.

The depicted example communication system 1200 includes communication links 1212-1226, any one or more of which could include one or more wireless-communication links and/or one or more wired-communication links. In FIG. 12, the communication links 1212 and 1214 are depicted with respective lightning-bolt graphics; while this graphic typically denotes wireless communication, and does in this example as well, this is not to the exclusion of one or more of the other communication links 1214-1226 being or at least including wireless-communication links as well.

As can be seen in FIG. 12, the communication link 1212 (as mentioned above) connects the commercial RANs 1202 and the WCDs 1210, the communication link 1214 (as mentioned above) connects the public-safety RAN 1204 and the WCDs 1210, the communication link 1216 connects the commercial RANs 1202 and the public-safety RAN 1204, the communication link 1218 connects the commercial RANs 1202 and the data network 1206, the communication link 1220 connects the commercial RANs 1202 and the circuit network 1208, the communication link 1222 connects the public-safety RAN 1204 and the data network 1206, the communication link 1224 connects the data network 1206 and the circuit network 1208, and the communication link 1226 connects the public-safety RAN 1204 and the circuit network 1208. This arrangement is provided purely by way of example, as other arrangements could be implemented by those of skill in the relevant art in various different contexts.

FIG. 13 depicts a further example of the communication system of FIG. 12, in accordance with an embodiment. FIG. 13 depicts the communication system 1200 of FIG. 12, though in more detail regarding some example WCDs 1210 and an example RAN 1202. In particular, FIG. 13 depicts the RAN 1202 as including an eNodeB 1302, an eNodeB 1304, an eNodeB 1306, and an eNodeB 1308, each of which communicate directly or indirectly with an evolved packet core (EPC) 1310 over a communication link 1312. As is the case with each of the communication links mentioned above, and as is the case with any of the communication links mentioned anywhere else in this disclosure, the communication link 1312 may be or include one or more wireless-communication links and/or one or more wired-communication links, as deemed suitable by those of skill in the relevant art in a given context.

In at least one embodiment, each of the eNodeBs 1302-1308 include the hardware and software (and/or firmware) necessary for that eNodeB to function as an eNodeB, a NodeB, a base station, a base transceiver station (BTS), a WiFi access point, and/or the like, as known to those having skill in the relevant art. In some instances, one or more of the eNodeBs in the example RAN 1202 may also include functionality typically associated in the art with entities that are often referred to by terms such as base station controllers (BSCs), radio network controllers (RNCs), and the like. Also, while four eNodeBs are depicted by way of example in FIG. 13, any suitable number of eNodeBs could be deployed as deemed suitable by those of skill in the relevant art.

In general, each eNodeB 1302-1308 is an entity that, on one side (i.e., the wireless-network side (interface)), engages in wireless communication over the air interface 1212 with one or more WCDs 1210 according to a protocol such as LTE or the like and, on the other side (i.e., the "backhaul" side), engages in communications with the EPC 1310 via the communication link 1312, to facilitate communications between various WCDs 1210 and networks such as the networks 1204, 1206, and 1208.

The EPC 1310 may include one or more network entities such as one or more mobility management entities (MMEs), one or more serving gateways (SGWs), one or more packet data network (PDN) gateways (PGWs), one or more evolved packet data gateways (ePDGs), one or more home subscriber servers (HSSs), one or more access network discovery and selection functions (ANDSFs), and/or one or more other entities deemed suitable for a given implementation by those of skill in the relevant art. Moreover, these entities may be configured and interconnected in a manner known to those of skill in the relevant art to provide wireless service to the WCDs 1210 via the eNodeBs 1302-1308, and to bridge such wireless service with various transport networks. In general, an example RAN 1202 may provide wireless service according to a protocol such as LTE, WiFi, and/or the like. These examples are provided for illustration and not by way of limitation; moreover, those of skill in the relevant art are aware of variations among different protocols and among different implementations of a given protocol, and of similarities across different protocols.

It is noted that this disclosure references, among other aspects, wireless channels, receivers and transmitters. In some descriptions, the receivers or transmitters are said to communicate via the wireless channels. In certain cases a WCD is said to connect to a certain network via a wireless channel. These forms of descriptions are meant to convey the same concept (that a certain communication interface is employed to communicate using a certain wireless channel), as will be appreciated by those in the relevant art.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a," "has . . . a," "includes . . . a," "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 1%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A dual-watch mobile radio including:
   a first receiver tuned to a first channel;
   a second receiver tuned to a second channel;
   an audio output port;
   a one-dimensional volume control;
   a transmitter; and
   a controller programmed to carry out a set of functions, the set of functions including:
      receiving a first audio signal via the first channel from the first receiver, and generating a first amplified audio signal at least in part by applying a first-signal gain to the first audio signal;
      receiving a second audio signal via the second channel from the second receiver, and generating a second amplified audio signal at least in part by applying a second-signal gain to the second audio signal;
      outputting the first and second amplified audio signals via the audio output port;
      receiving volume-control commands from the one-dimensional volume control, each received volume-control command having a degree; and
      adjusting the first-signal gain and the second-signal gain according to the received volume-control commands at least in part by, for each such received volume-control command:
         applying a first gain function to the first-signal gain and the second-signal gain when the degree is in a first degree range; and
         instead applying a second gain function to the first-signal gain and the second-signal gain when the degree is in a second degree range; and
      wherein at any given time, one of the first and second channels is designated by the dual-watch mobile radio as its selected channel and the other as its unselected channel, by:
         designating the first channel as its selected channel and the second channel as its unselected channel when the first-signal gain exceeds the second-signal gain by more than a channel-swap threshold;
         designating the second channel as its selected channel and the first channel as its unselected channel when the second-signal gain exceeds the first-signal gain by more than the channel-swap threshold; and
         swapping which of the first and second channels is designated as its selected and unselected channels when a difference between the first-signal gain and the second-signal gain falls below the channel-swap threshold; and
      wherein the transmitter of the dual-watch mobile radio transmits any outbound media via the transmitter on its current selected channel.

2. The dual-watch mobile radio of claim 1, wherein the one-dimensional volume control is a rotary control knob.

3. The dual-watch mobile radio of claim 2, wherein the degree is a rotation rate.

4. The dual-watch mobile radio of claim 3,
   wherein the first degree range corresponds to rotation rates that do not exceed a rotation-rate threshold; and
   wherein the second degree range corresponds to rotation rates that do exceed the rotation-rate threshold.

5. The dual-watch mobile radio of claim 1, wherein the one-dimensional volume control is a two-button volume control.

6. The dual-watch mobile radio of claim 5, wherein the degree is a depression duration.

7. The dual-watch mobile radio of claim 6,
   wherein the first degree range corresponds to depression durations that do not exceed a depression-duration threshold; and
   wherein the second degree range corresponds to depression durations that do exceed the depression-duration threshold.

8. The dual-watch mobile radio of claim 5, wherein the degree is a depression rate.

9. The dual-watch mobile radio of claim 8,
   wherein the first degree range corresponds to depression rates that do not exceed a depression-rate threshold; and
   wherein the second degree range corresponds to depression rates that do exceed the depression-rate threshold.

10. The dual-watch mobile radio of claim 1, further including first and second transmitters, wherein the dual-watch mobile radio transmits any outbound media over the first channel via the first transmitter when the first channel is its current selected channel, wherein the dual-watch mobile radio transmits any outbound media over the second channel via the second transmitter when the second channel is its current selected channel.

11. The dual-watch mobile radio of claim 1, the set of functions further including outputting a notification responsive to the difference between the first-signal gain and the second-signal gain falling below the channel-swap threshold.

12. The dual-watch mobile radio of claim 11,
   wherein the notification comprises a notification sound;
   wherein the notification sound is a first sound when the difference between the first-signal gain and the second-signal gain falls below the channel-swap threshold as a result of the one-dimensional volume control being adjusted in a first direction; and
   wherein the notification sound is a second sound when the difference between the first-signal gain and the second-signal gain falls below the channel-swap threshold as a result of the one-dimensional volume control being adjusted in a second direction.

13. The dual-watch mobile radio of claim 1,
   wherein the audio output port includes a first output port to a first speaker set and a second output port to a second speaker set; and
   wherein outputting the first and second amplified audio signals via the audio output port includes:
   outputting the first amplified signal via the first output port; and
   outputting the second amplified signal via the second output port.

14. The dual-watch mobile radio of claim 1,
   wherein the audio output port includes a first output port to a first speaker set and a second output port to a second speaker set, wherein the first speaker set is configured to be closer to a user's ear than the second speaker set; and
   wherein outputting the first and second amplified audio signals via the audio output port includes:
   outputting the one of the first and second amplified signals that corresponds to the selected channel via the first output port; and
   outputting the other of the first and second amplified signals via the second output port.

15. The dual-watch mobile radio of claim 14, wherein the first speaker set is an in-ear speaker set, wherein the second speaker set is not an in-ear speaker set.

16. The dual-watch mobile radio of claim 1,
wherein each received volume-control input further has a direction;
wherein applying the first gain function to the first-signal gain and the second-signal gain includes:
changing the gain of the signal that corresponds to the selected channel in the direction by a first amount, and
changing the gain of the signal that corresponds to the unselected channel in the direction by a second amount, wherein the first amount is greater than the second amount by a first difference; and
wherein applying the second gain function to the first-signal gain and the second-signal gain includes:
changing the gain of the signal that corresponds to the selected channel in the direction by a third amount, and
changing the gain of the signal that corresponds to the unselected channel in the direction by a fourth amount, wherein the third amount is greater than the fourth amount by a second difference, wherein the first difference is greater than the second difference.

17. The dual-watch mobile radio of claim 11,
wherein each received volume-control input further has a direction that is either a first direction or a second direction;
wherein applying the first gain function to the first-signal gain and the second-signal gain includes:
increasing the first-signal gain and decreasing the second-signal gain when the direction is the first direction, and
increasing the second-signal gain and decreasing the first-signal gain when the direction is the second direction; and
wherein applying the second gain function to the first-signal gain and the second-signal gain includes:
changing the gain of the signal that corresponds to the selected channel in the direction, and
changing the gain of the signal that corresponds to the unselected channel in the direction.

18. The dual-watch mobile radio of claim 1,
wherein each received volume-control input further has a direction that is either a first direction or a second direction;
wherein applying the first gain function to the first-signal gain and the second-signal gain includes:
increasing the gain of the signal that corresponds to the selected channel and decreasing the gain of the signal that corresponds to the unselected channel when the direction is the first direction, and
increasing the gain of the signal that corresponds to the unselected channel and decreasing the gain of the signal that corresponds to the selected channel when the direction is the second direction; and
wherein applying the second gain function to the first-signal gain and the second-signal gain includes:
changing the gain of the signal that corresponds to the selected channel in the direction, and
changing the gain of the signal that corresponds to the unselected channel in the direction.

19. The dual-watch mobile radio of claim 1,
wherein each received volume-control input further has a direction that is either a first direction or a second direction; and
wherein applying the first gain function to the first-signal gain and the second-signal gain includes:
increasing the first-signal gain and decreasing the second-signal gain when the direction is the first direction, and
increasing the second-signal gain and decreasing the first-signal gain when the direction is the second direction; and
wherein applying the second gain function to the first-signal gain and the second-signal gain includes:
changing the first-signal gain in the direction, and
changing the second-signal gain in the direction.

20. A method carried out by a dual-watch mobile radio, the method including:
receiving a first audio signal via a first channel from a first receiver, and generating a first amplified audio signal at least in part by applying a first-signal gain to the first audio signal;
receiving a second audio signal via a second channel from a second receiver, and generating a second amplified audio signal at least in part by applying a second-signal gain to the second audio signal;
outputting the first and second amplified audio signals via an audio output port;
receiving volume-control commands from a one-dimensional volume control, each received volume-control command having a degree; and
adjusting the first-signal gain and the second-signal gain according to the received volume-control commands at least in part by, for each such received volume-control command:
applying a first gain function to the first-signal gain and the second-signal gain when the degree is in a first degree range;
instead, applying a second gain function to the first-signal gain and the second-signal gain when the degree is in a second degree range; and
wherein at any given time, one of the first and second channels is designated by the dual-watch mobile radio as its selected channel and the other as its unselected channel by:
designating the first channel as its selected channel and the second channel as its unselected channel when the first-signal gain exceeds the second-signal gain by more than a channel-swap threshold;
designating the second channel as its selected channel and the first channel as its unselected channel when the second-signal gain exceeds the first-signal gain by more than the channel-swap threshold; and
swapping which of the first and second channels is designated as its selected and unselected channels when a difference between the first-signal gain and the second-signal gain falls below the channel-swap threshold;
and
transmitting any outbound media over its current selected channel.

* * * * *